(12) United States Patent
Fujisawa et al.

(10) Patent No.: US 11,971,306 B2
(45) Date of Patent: Apr. 30, 2024

(54) INFRARED DETECTING DEVICE

(71) Applicant: Mitsubishi Electric Corporation, Tokyo (JP)

(72) Inventors: Daisuke Fujisawa, Tokyo (JP); Masashi Ueno, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 125 days.

(21) Appl. No.: 17/781,735

(22) PCT Filed: Dec. 25, 2020

(86) PCT No.: PCT/JP2020/048675
§ 371 (c)(1),
(2) Date: Jun. 2, 2022

(87) PCT Pub. No.: WO2021/161675
PCT Pub. Date: Aug. 19, 2021

(65) Prior Publication Data
US 2023/0003584 A1     Jan. 5, 2023

(30) Foreign Application Priority Data
Feb. 10, 2020   (JP) .................. 2020-020770

(51) Int. Cl.
*G01J 5/24*      (2006.01)
*G01K 7/01*      (2006.01)
(Continued)

(52) U.S. Cl.
CPC .............. *G01J 5/24* (2013.01); *G01K 7/015* (2013.01); *G01J 2005/0077* (2013.01); *G01J 2005/202* (2013.01)

(58) Field of Classification Search
None
See application file for complete search history.

(56) References Cited

U.S. PATENT DOCUMENTS 6,028,309 A * 2/2000 Parrish ................ G01J 5/20
                                              250/252.1
2003/0006746 A1  1/2003 Nishimura
(Continued)

FOREIGN PATENT DOCUMENTS

JP    2002-328732 A    11/2002
JP    2005-241501 A     9/2005
(Continued)

OTHER PUBLICATIONS

International Search Report and Written Opinion dated Mar. 23, 2021, received for PCT Application PCT/JP2020/048675, Filed on Dec. 25, 2020, 9 pages including English Translation.
(Continued)

*Primary Examiner* — Marcus H Taningco
(74) *Attorney, Agent, or Firm* — XSENSUS LLP

(57) ABSTRACT

A diode (11) is provided on a substrate (1) and thermally insulated from the substrate (1). A positive feedback circuit (18) provides a positive feedback loop so that when a current of the diode (11) decreases due to a change in temperature of the diode (11), the positive feedback circuit (18) further decreases the current of the diode (11), and when the current of the diode (11) increases, the positive feedback circuit (18) further increases the current of the diode (11).

12 Claims, 11 Drawing Sheets

(51) Int. Cl.
  *G01J 5/00* (2022.01)
  *G01J 5/20* (2006.01)

(56) References Cited

U.S. PATENT DOCUMENTS

| | | | |
|---|---|---|---|
| 2003/0057372 A1* | 3/2003 | Iida et al. | H01L 27/14649 348/E5.09 |
| 2008/0251721 A1 | 10/2008 | Ueno | |
| 2009/0194698 A1 | 8/2009 | Onakado et al. | |
| 2009/0261445 A1 | 10/2009 | Sugino | |
| 2012/0228506 A1* | 9/2012 | Honda | G01J 5/22 250/338.4 |
| 2015/0241282 A1* | 8/2015 | Honda | G01J 5/12 250/338.4 |
| 2016/0131535 A1 | 5/2016 | Nakashimo | |

FOREIGN PATENT DOCUMENTS

| | | |
|---|---|---|
| JP | 2007-225398 A | 9/2007 |
| JP | 2008-258973 A | 10/2008 |
| JP | 2009-186457 A | 8/2009 |
| JP | 2009-265094 A | 11/2009 |
| JP | 2010-199702 A | 9/2010 |
| JP | 2016-90525 A | 5/2016 |
| JP | 2016-535470 A | 11/2016 |
| WO | 2015/048059 A1 | 4/2015 |
| WO | 2018/235817 A1 | 12/2018 |

OTHER PUBLICATIONS

Ishikawa et al., "Low-cost 320x240 uncooled IRFPA using conventional silicon IC process" Opto-Electronics Review, vol. 7, No. 4, Jul. 1999, pp. 297-303.
Notice of Reasons for Refusal dated Oct. 26, 2021, received for JP Application 2021-530257, 7 pages Including English Translation.
Notice of Reasons for Refusal dated Feb. 22, 2022, received for JP Application 2021-530257, 4 pages Including English Translation.

* cited by examiner

INFRARED DETECTING DEVICE

CROSS-REFERENCE TO RELATED APPLICATIONS

The present application is based on PCT filing PCT/JP2020/048675, filed Dec. 25, 2020, which claims priority to JP 2020-020770, filed Feb. 10, 2020, the entire contents of each are incorporated herein by reference.

FIELD

The present disclosure relates to an infrared detecting device that converts infrared rays into heat and detects it.

BACKGROUND

Infrared detecting devices are roughly classified into quantum type infrared detecting devices and thermal type infrared detecting devices. The quantum type infrared detecting device is a cooled type infrared detecting device requiring a cooling machine. On the other hand, the thermal type infrared detecting device is an uncooled type infrared detecting device not requiring a cooling machine and can be therefore miniaturized. The thermal type infrared detecting device is a detecting device that converts infrared rays absorbed by an infrared absorber into heat and converts a temperature change caused by the heat into an electric signal.

In recent years, cost reduction aiming at consumer applications of the infrared detecting device has progressed and a sensing capability has been improved. If a diode is used as a temperature sensor in the infrared detecting device, the detection sensitivity of the infrared detecting device is enhanced by connecting a plurality of diodes in series because a temperature change rate of each of the diodes is small.

As many diodes as possible have been required to be connected in series and arranged in the limited area of a temperature sensing portion in an infrared detecting device. On the other hand, an infrared detecting device in which adjacent first and second diodes are connected to each other by a metal film provided on a surface of a recess formed to span a p-type layer of the first diode and an N-type layer of the second diode has been proposed (see, e.g., PTL 1). As a result, a spacing between the adjacent diodes is smaller than that when the diodes are separated from each other through an oxide film. Therefore, the plurality of diodes can be formed at a high density. Thus, the detection sensitivity of the infrared detecting device can be enhanced.

CITATION LIST

Patent Literature

[PTL 1] JP 2009-265094 A

SUMMARY

Technical Problem

In the conventional infrared detecting device, the number of the plurality of diodes connected in series in the temperature sensing portion needs to be increased to enhance the detection sensitivity. The increase in the number of the diodes leads to an increase in size of the infrared detecting device, and requires a high power supply voltage.

The present disclosure has been made to solve the above-described problem, and is directed to obtaining an infrared detecting device the detection sensitivity of which can be enhanced without increasing the number of diodes.

Solution to Problem

An infrared detecting device according to the present disclosure includes: a substrate; a diode provided on the substrate and thermally insulated from the substrate; and a positive feedback circuit providing a positive feedback loop so that when a current of the diode decreases due to a change in temperature of the diode, the positive feedback circuit further decreases the current of the diode, and when the current of the diode increases, the positive feedback circuit further increases the current of the diode.

Advantageous Effects of Invention

The infrared detecting device of the present disclosure configured as described above can increase the detection sensitivity without increasing the number of the diodes.

DESCRIPTION OF EMBODIMENTS

An infrared detecting device according to the embodiments of the present disclosure will be described with reference to the drawings. The same components will be denoted by the same symbols, and the repeated description thereof may be omitted.

Embodiment 1

Figure 1:
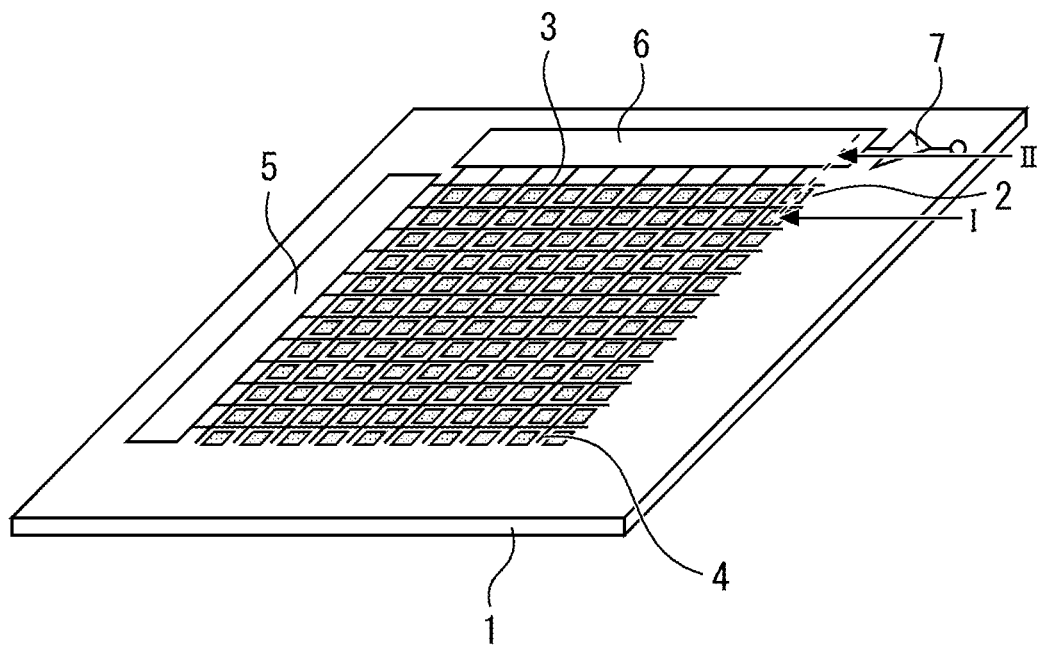
FIG. 1 is a perspective view illustrating an infrared imaging apparatus according to Embodiment 1.

FIG. 1 is a perspective view illustrating an infrared imaging apparatus according to Embodiment 1. A plurality of infrared detecting devices 2 are two-dimensionally arranged in an array shape or a matrix shape on a substrate 1. Selection lines 3 and signal lines 4 are provided along the plurality of infrared detecting devices 2. The selection lines 3 are connected to a drive scanning circuit 5. The signal lines 4 are connected to a signal scanning circuit 6. The drive scanning circuit 5 and the signal scanning circuit 6 are provided around the plurality of infrared detecting devices 2. An output signal of the infrared detecting device 2 selected by the drive scanning circuit 5 and the signal scanning circuit 6 is amplified by an output amplifier 7 composed of an integration circuit.

Figure 2:
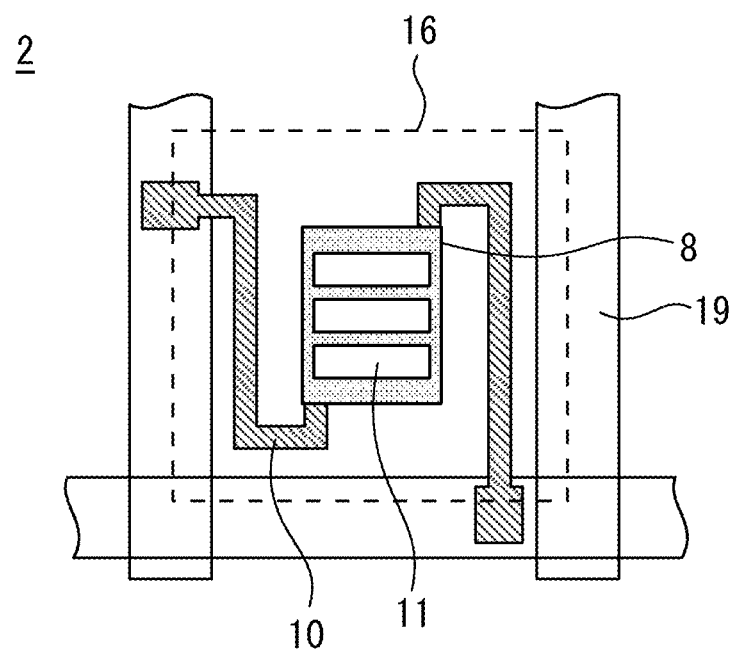
FIG. 2 is a top view illustrating the infrared detecting device according to Embodiment 1.

FIG. 2 is a top view illustrating the infrared detecting device according to Embodiment 1. The infrared detecting device 2 has an insulation structure formed using a micromachining technique. An infrared sensing portion 8 is formed on the insulation structure. The infrared sensing portion 8 is thermally insulated from the substrate 1 by the insulation structure. The infrared sensing portion 8 rises in temperature when infrared rays are incident thereon. The temperature rise is detected by the infrared sensing portion 8, and is outputted as an electric signal. Respective output signals of the plurality of infrared detecting devices 2 are read out in time series using a scanning operation of the drive scanning circuit 5 and the signal scanning circuit 6, to obtain an infrared image signal.

Figure 3:
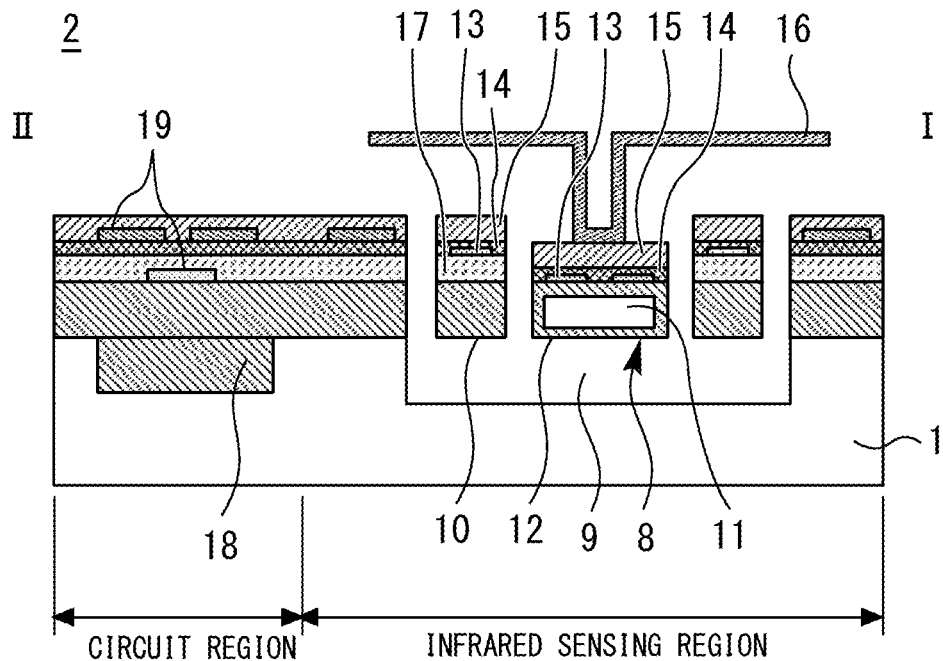
FIG. 3 is a cross-sectional view taken along a line I-II illustrated in FIG. 1.

FIG. 3 is a cross-sectional view taken along a line I-II illustrated in FIG. 1. The infrared detecting device 2 includes an infrared sensing region and a circuit region. The substrate 1 is an SOI (silicon on insulator) substrate, for example. In the infrared sensing region, the substrate 1 is provided with a cavity 9. The infrared sensing portion 8 is arranged in the cavity 9 with it being spaced apart from the substrate 1, and is supported by a support leg 10. The cavity 9 has the above-described insulation structure.

The infrared sensing portion 8 is a pixel including a plurality of diodes 11 connected in series as a temperature sensor. Examples of the diode 11 include a Schottky diode and a tunnel diode. Instead of the diode 11, there is provided another thermoelectric conversion device having an electrical characteristic changing depending on a temperature. A thin film wiring 13, an interlayer insulating film 14, and a protective film 15 are sequentially provided on an insulating film 12 that covers the diode 11. The thin film wiring 13 is connected to the diode 11. An infrared absorbing portion 16 having an umbrella structure for absorbing infrared rays is provided on the protective film 15.

The support leg 10 has a laminate structure of the insulating film 12, an interlayer insulating film 17, the thin film wiring 13, the interlayer insulating film 14, and the protective film 15. The insulating film 12, the interlayer insulating film 17, the interlayer insulating film 14, and the protective film 15 are each composed of silicon oxide or silicon nitride, for example. The thin film wiring 13 is composed of a metal such as aluminum, Ti, TiN, Ni, Cr, or Pt or polycrystalline silicon.

In the circuit region, a positive feedback circuit 18 and a wiring 19 connected to the positive feedback circuit 18 are provided. The positive feedback circuit 18 includes a scanning circuit, a current source circuit, a power supply circuit, an integration circuit, or a MOS (metal oxide semiconductor) transistor.

In the infrared detecting device 2, the incident infrared rays are converted into heat upon being absorbed by the infrared absorbing portion 16, and the heat is conducted to the infrared sensing portion 8. When the temperature of the infrared sensing portion 8 rises, an electrical characteristic of the diode 11 included in the infrared sensing portion 8 changes. The thin film wiring 13 connected to each of the p-side and the n-side of the diode 11 is connected to the wiring 19 through the support leg 10. A change in the electrical characteristic of the diode 11 is taken out as an electric signal to the positive feedback circuit 18 through the thin film wiring 13 and the wiring 19, and is used to detect the incident infrared rays.

Figure 4:
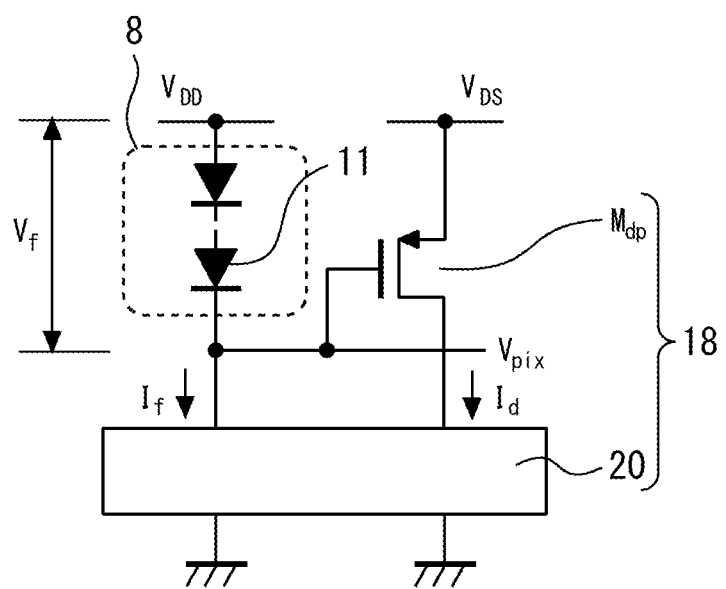
FIG. 4 is a circuit diagram illustrating the infrared detecting device according to Embodiment 1.

FIG. 4 is a circuit diagram illustrating the infrared detecting device according to Embodiment 1. The infrared sensing portion 8 includes the plurality of diodes 11 connected in series. The diode 11 has its anode connected to a first power supply $V_{DD}$. A cathode voltage of the diode 11 is outputted as an output voltage $V_{pix}$ of the infrared detecting device 2.

The positive feedback circuit 18 includes a P-type MOS transistor Mdp and a current mirror circuit 20. The P-type MOS transistor Mdp has its gate receiving the cathode voltage of the diode 11. The P-type MOS transistor Mdp has its source connected to a second power supply $V_{DS}$.

Figure 5:
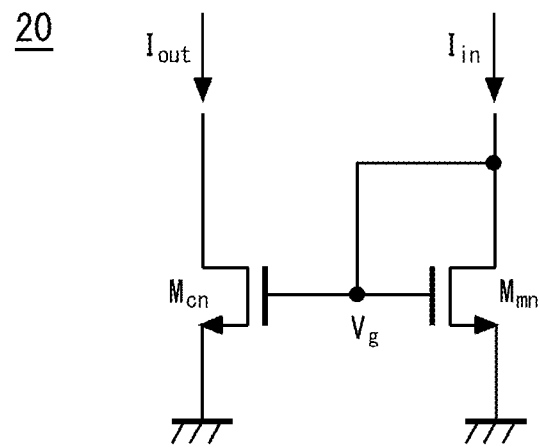
FIG. 5 is a circuit diagram illustrating the current mirror circuit.
Figure 6:
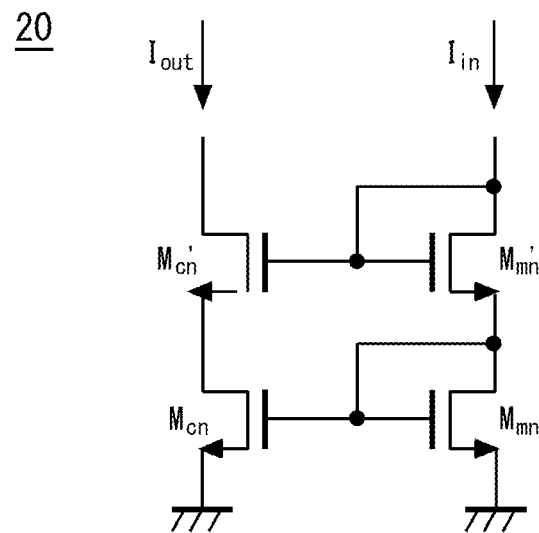
FIG. 6 is a circuit diagram illustrating the current mirror circuit.

The current mirror circuit 20 receives a drain current of the P-type MOS transistor Mdp. An output of the current mirror circuit 20 is connected to a cathode of the diode 11. FIGS. 5 and 6 are circuit diagrams each illustrating the current mirror circuit. The current mirror circuit 20 illustrated in FIG. 5 includes N-type MOS transistors Mmn and Mcn. The N-type MOS transistor Mmn has its drain and gate connected to each other, and is connected to a gate of the N-type MOS transistor Mcn. The N-type MOS transistors Mmn and Mcn have their respective sources grounded. An input current Iin is inputted to the drain of the N-type MOS transistor Mmn, and an output current Iout is inputted to a drain of the N-type MOS transistor Mcn. The current mirror circuit 20 illustrated in FIG. 6 includes N-type MOS transistors Mmm, Mcn, Mmn', and Mcn'. The N-type MOS transistor Mmn has its drain and gate connected to each other, and is connected to a gate of the N-type MOS transistor Mcn. The N-type MOS transistors Mmn and Mcn have their respective sources grounded. The N-type MOS transistor Mmn' has its drain and gate connected to each other, and is connected to a gate of the N-type MOS transistor Mcn'. The N-type MOS transistors Mmn' and Mcn' have their respective sources connected to the drain of the N-type MOS transistor Mmn and a drain of the N-type MOS transistor Mcn. An input current Iin is inputted to the drain of the N-type MOS transistor Mmn', and an output current Iout is inputted to a drain of the N-type MOS transistor Mcn'.

In the infrared detecting device having such a configuration, when a temperature of the plurality of diodes 11 rises, a forward voltage Vf of the plurality of diodes 11 decreases. Therefore, a gate voltage of the P-type MOS transistor Mdp as a voltage obtained by subtracting a voltage Vf from a voltage of the power supply $V_{DD}$ increases, and a current Id of the P-type MOS transistor Mdp decreases. The current mirror circuit 20 decreases a current If of the diode 11 according to the decrease in the current. As a result, the forward voltage Vf further decreases.

When the temperature of the diodes 11 drops, the forward voltage Vf of the plurality of diodes 11 increases. Therefore, a gate voltage of the P-type MOS transistor Mdp decreases, and the current Id of the P-type MOS transistor Mdp increases. The current mirror circuit 20 increases the current If of the diodes 11 according to the increase in the current. As a result, the forward voltage Vf of the diodes 11 further increases. Therefore, respective changes of the forward voltage Vf and the current If of the diodes 11 are subjected to a positive feedback loop.

Figure 7:
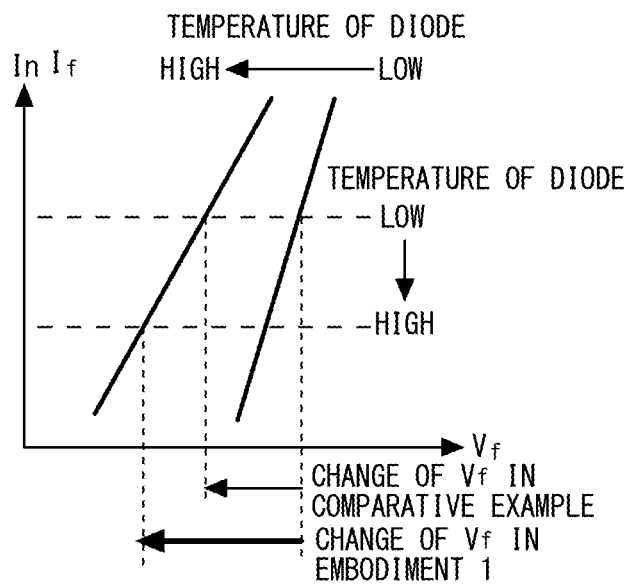
FIG. 7 is a diagram illustrating a voltage-current characteristic of the diodes in the infrared detecting device according to Embodiment 1.

FIG. 7 is a diagram illustrating a voltage-current characteristic of the diodes in the infrared detecting device according to Embodiment 1. An infrared detecting device in a comparative example does not have the positive feedback circuit 18 in the infrared detecting device in Embodiment 1 and is configured such that diodes 11 are subjected to constant current driving by a current source. In the comparative example, when a temperature of the diodes 11 rises, a voltage Vf of the diodes only decreases. In the present embodiment, when the temperature of the diodes 11 as a temperature sensor rises by incident infrared rays, the forward voltage Vf of the diodes 11 decreases. Therefore, a gate voltage of the P-type MOS transistor Mdp as a voltage obtained by subtracting the voltage Vf from the voltage of the power supply $V_{DD}$ increases, and the current Id of the P-type MOS transistor Mdp decreases. A current mirror circuit 20 decreases the current If of the diodes 11 according to the decrease in the current. As a result, the forward voltage Vf further decreases. Therefore, a voltage change that is not less than a voltage change obtained from one of the diodes by absolving incident infrared rays in a constant current operation of the diodes in the comparative example is obtained. As a result, the detection sensitivity of the infrared detecting device can be increased without increasing the number of the diodes.

To stabilize a circuit operation, letting Z be an impedance of the diode 11, gmd be a mutual conductance of the P-type MOS transistor Mdp, and κ be a current mirror current ratio (output/input), a relationship of 0<κ·gmd·Z<1 is preferably satisfied.

Embodiment 2

Figure 8:
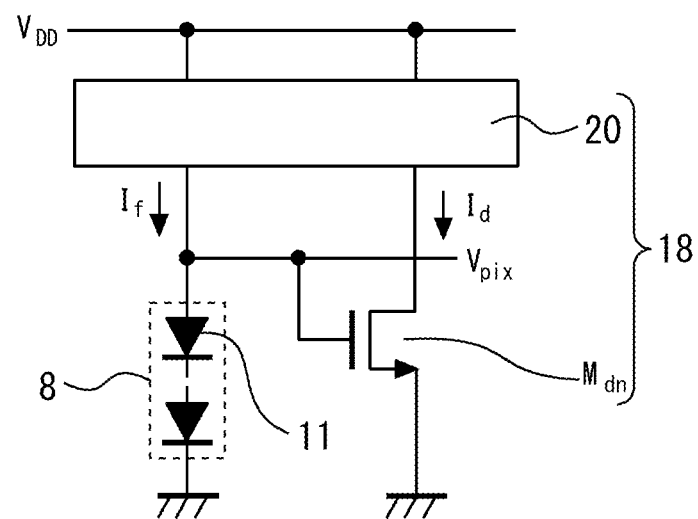
FIG. 8 is a circuit diagram illustrating an infrared detecting device according to Embodiment 2.

FIG. 8 is a circuit diagram illustrating an infrared detecting device according to Embodiment 2. A plurality of diodes 11 have their respective cathodes grounded. An anode voltage of the diode 11 is outputted as an output voltage $V_{pix}$ of a thermal-type infrared detecting device.

A positive feedback circuit 18 includes an N-type MOS transistor Mdn and a current mirror circuit 20. The N-type MOS transistor Mdn has its gate receiving the anode voltage of the diode 11. The N-type MOS transistor Mdn has its source grounded.

Figure 9:
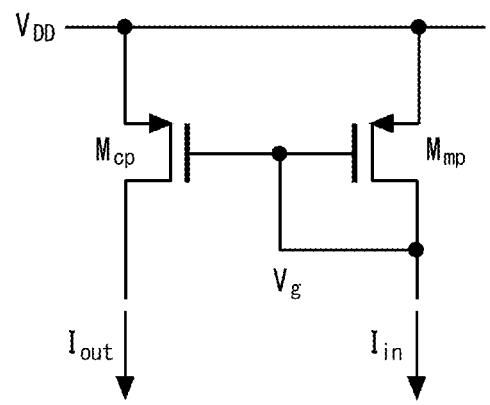
FIG. 9 is a circuit diagram illustrating the current mirror circuit.
Figure 10:
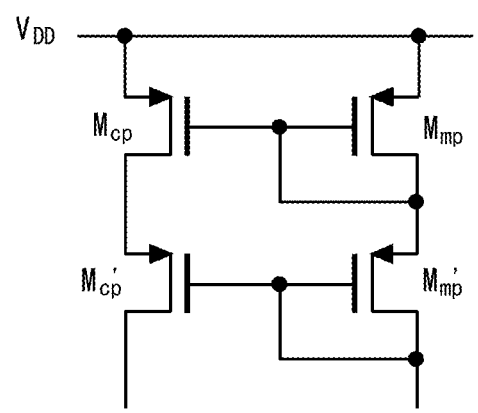
FIG. 10 is a circuit diagram illustrating the current mirror circuit.

The current mirror circuit 20 receives a drain current of the N-type MOS transistor Mdn. An output of the current mirror circuit 20 is connected to an anode of the diode 11. FIGS. 9 and 10 are circuit diagrams each illustrating the current mirror circuit. The current mirror circuit 20 illustrated in FIG. 9 includes P-type MOS transistors Mmp and Mcp. The P-type MOS transistor Mmp has its drain and gate connected to each other, and is connected to a gate of the P-type MOS transistor Mcp. The P-type MOS transistors Mmp and Mcp have their respective sources connected to a power supply $V_{DD}$. An input current Iip is drawn from the drain of the P-type MOS transistor Mmp, and an output current Iout is drawn from a drain of the P-type MOS transistor Mcp. The current mirror circuit 20 illustrated in FIG. 10 includes P-type MOS transistors Mmp, Mcp, Mmp', and Mcp'. The P-type MOS transistor Mmp has its drain and gate connected to each other, and is connected to a gate of the P-type MOS transistor Mcp. The P-type MOS transistors Mmp and Mcp have their respective sources connected to a power supply $V_{DD}$. The P-type MOS transistor Mmp' has its drain and gate connected to each other, and is connected to a gate of the P-type MOS transistor Mcp'. The P-type MOS transistors Mmp' and Mcp' have their respective sources connected to the drain of the P-type MOS transistor Mmp and a drain of the P-type MOS transistor Mcp. An input current Iip is drawn from the drain of the P-type MOS transistor Mmp', and an output current Iout is drawn from a drain of the P-type MOS transistor Mcp'.

In the infrared detecting device having such a configuration, when a temperature of the plurality of diodes 11 rises, a forward voltage Vf of the plurality of diodes 11 decreases. Therefore, a gate voltage of the N-type MOS transistor Mdn decreases, and a current Id of the N-type MOS transistor Mdn decreases. The current mirror circuit 20 decreases a current If of the diodes 11 according to the decrease in the current. As a result, the voltage Vf further decreases.

When the temperature of the diodes 11 drops, the forward voltage Vf of the plurality of diodes 11 increases. Therefore, a gate voltage of the N-type MOS transistor Mdn increase, and the current Id of the N-type MOS transistor Mdn increases. The current mirror circuit 20 increases the current If of the diodes 11 according to the increase in the current. As a result, the forward voltage Vf of the diodes 11 further increases.

Therefore, respective changes in the forward voltage Vf and the current If of the diodes 11 are subjected to a positive feedback loop. Therefore, a voltage change that is not less than a voltage change obtained from one of the diodes by absolving incident infrared rays in a constant current operation of the diodes in the comparative example is obtained, as described in Embodiment 1 with reference to FIG. 7. As a result, the detection sensitivity of the infrared detecting device can be increased without increasing the number of the diodes.

To stabilize a circuit operation, letting Z be an impedance of the diode 11, gmd be a mutual conductance of the N-type MOS transistor Mdn, and κ be a current mirror current ratio (output/input), a relationship of 0<κ·gmd·Z<1 is preferably satisfied.

Embodiment 3

Figure 11:
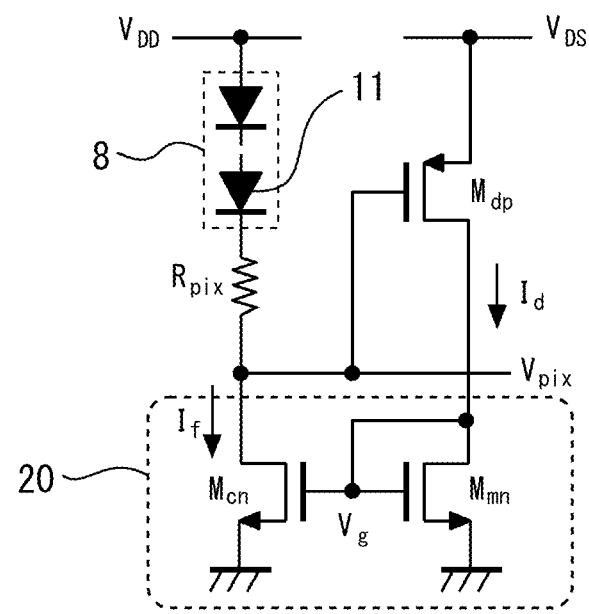
FIG. 11 is a circuit diagram illustrating an infrared detecting device according to Embodiment 3.

FIG. 11 is a circuit diagram illustrating an infrared detecting device according to Embodiment 3. A resistor $R_{pix}$ is connected between a cathode of a diode 11 and an output of a current mirror circuit 20. When a temperature of the diode 11 rises, a diode voltage Vf decreases. A current If of the diode 11 decreases by a positive feedback loop, and the diode voltage Vf further decreases. At this time, an output voltage $V_{pix}$ of the infrared detecting device is determined by the diode voltage Vf and a voltage drop amount in the resistor $R_{pix}$ by the current If of the diode 11. When the current If of the diode 11 decreases, the voltage drop amount in the resistor $R_{pix}$ also decreases. Thus, a change in the output voltage $V_{pix}$ of the infrared detecting device further increases. As a result, an infrared detecting device having a high sensitivity can be implemented. Other components and effects are similar to those in Embodiment 1.

If the current If of the diode 11 is on the order of several microamperes, a resistor having a high resistance of about several kiloohms is used as the resistor $R_{pix}$. As a result, the voltage drop amount in the resistor $R_{pix}$ by the current If of the diode 11 can be increased.

Figure 12:
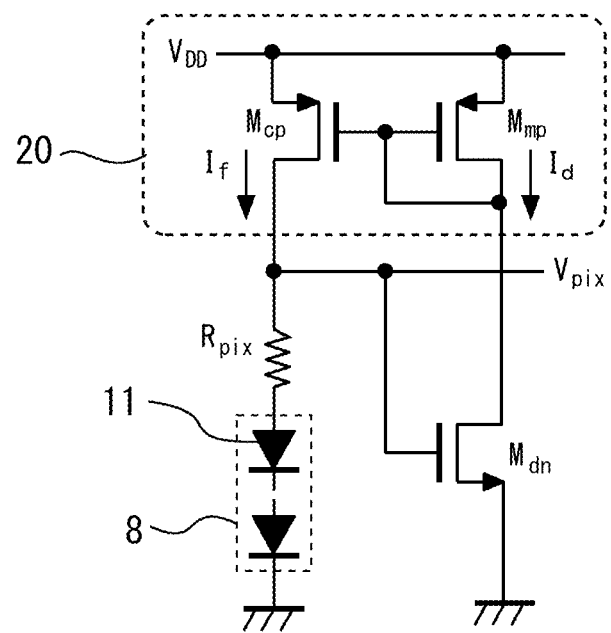
FIG. 12 is a circuit diagram illustrating a modification of the infrared detecting device according to Embodiment 3.

FIG. 12 is a circuit diagram illustrating a modification of the infrared detecting device according to Embodiment 3. A resistor $R_{pix}$ is connected between an anode of a diode 11 and a current mirror circuit 20. As a result, an infrared detecting device having a high sensitivity can be implemented. Other components and effects are similar to those in Embodiment 2.

Embodiment 4

Figure 13:
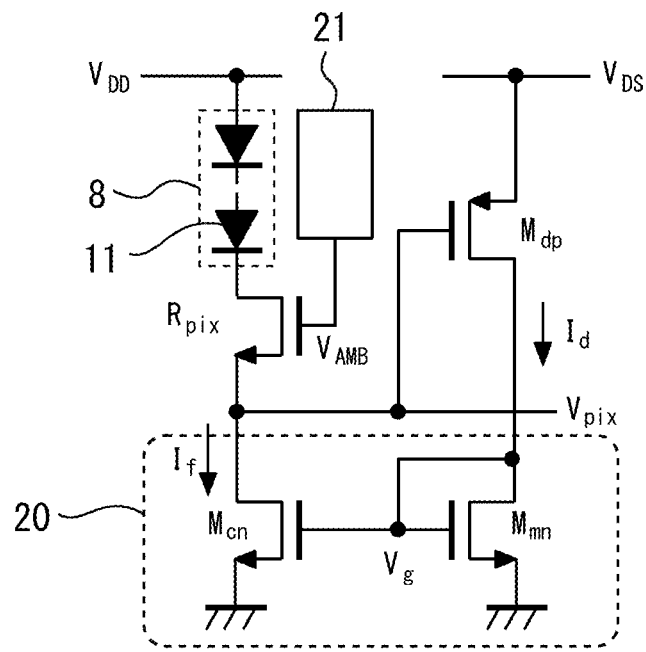
FIG. 13 is a circuit diagram illustrating an infrared detecting device according to Embodiment 4.

FIG. 13 is a circuit diagram illustrating an infrared detecting device according to Embodiment 4. The resistor $R_{pix}$ in Embodiment 3 illustrated in FIG. 11 is composed of an N-type MOS transistor. Even when not only when a temperature rise occurs by incident infrared rays but also when an environmental temperature as a temperature around the infrared detecting device when using the infrared detecting device increases, a current If of a diode 11 decreases so that a gain changes. A control circuit 21 changes a gate voltage $V_{AMB}$ of the N-type MOS transistor composing the resistor $R_{pix}$ according to the environmental temperature. The higher the environmental temperature becomes, the smaller a resistance value of the resistor $R_{pix}$ is made. As a result, the change in the gain due to a change in the environmental temperature can be reduced. The N-type MOS transistor is used in an operation range of a linear region relative to the change in the environmental temperature. Other components and effects are similar to those in Embodiment 3.

Figure 14:
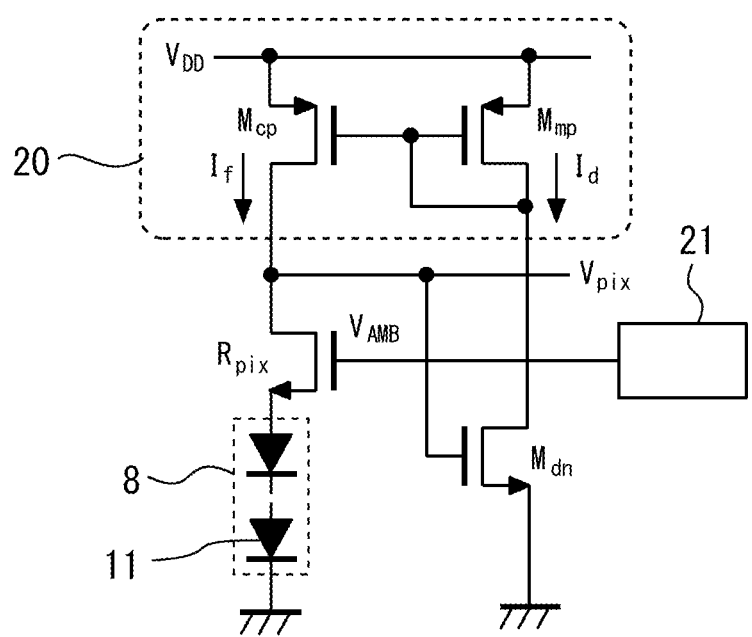
FIG. 14 is a circuit diagram illustrating a modification of the infrared detecting device according to Embodiment 4.

FIG. 14 is a circuit diagram illustrating a modification of the infrared detecting device according to Embodiment 4. The resistor $R_{pix}$ in the modification of Embodiment 3 illustrated in FIG. 12 is composed of an N-type MOS transistor. A control circuit 21 changes a gate voltage $V_{AMB}$ of the N-type MOS transistor according to an environmental temperature. The higher the environmental temperature becomes, the smaller a resistance value of the resistor $R_{pix}$ is made. As a result, a change in gain due to a change in the environmental temperature can be reduced. Other components and effects are similar to those in Embodiment 3.

Embodiment 5

Figure 15:
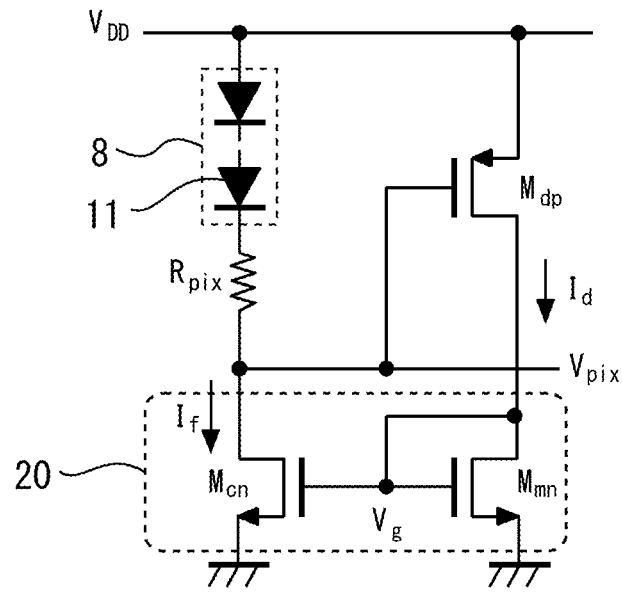
FIG. 15 is a circuit diagram illustrating an infrared detecting device according to Embodiment 5.

FIG. 15 is a circuit diagram illustrating an infrared detecting device according to Embodiment 5. An anode of a diode 11 and a source of a P-type MOS transistor Mdp are connected to the same power supply $V_{DD}$. As a result, an anode voltage of the diode 11 and a source voltage of the P-type MOS transistor Mdp are the same. Thus, the sensitivity of the infrared detecting device does not change when a power supply voltage varies. There is no change in gain due to the variation in the power supply voltage. Other components and effects are similar to those in Embodiment 3.

Embodiment 6

Figure 16:
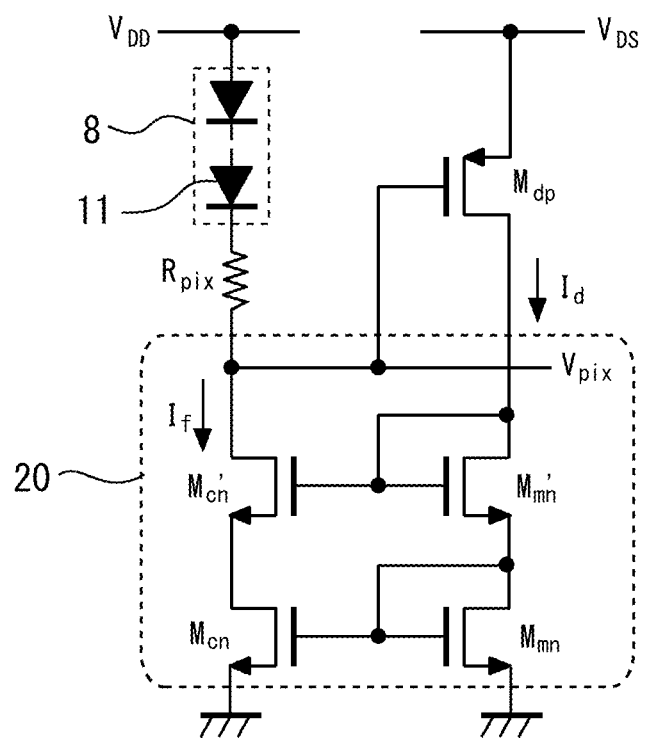
FIG. 16 is a circuit diagram illustrating an infrared detecting device according to Embodiment 6.

FIG. 16 is a circuit diagram illustrating an infrared detecting device according to Embodiment 6. A current mirror circuit 20 includes cascode-connected N-type MOS transistors Mmn, Mcn, Mmn', and Mcn'. The N-type MOS transistor Mmn has its drain and gate connected to each other, and is connected to a gate of the N-type MOS transistor Mcn. The N-type MOS transistors Mmn and Mcn have their respective sources grounded. The N-type MOS transistor Mmn' has its drain and gate connected to each other, and is connected to a gate of the N-type MOS transistor Mcn'. The N-type MOS transistors Mmn' and Mcn' have their respective sources connected to the drain of the N-type MOS transistor Mmn and a drain of the N-type MOS transistor Mcn. The drain of the N-type MOS transistor Mmn' is connected to a drain of a P-type MOS transistor Mdp, and the N-type MOS transistor Mcn' has its drain connected to a resistor $R_{pix}$. As a result, respective drain voltages of the N-type MOS transistor Mmn and the N-type MOS transistor Mcn in the current mirror circuit 20 match each other, and the replication accuracy of a current in the current mirror circuit 20 is improved. Other components and effects are similar to those in Embodiment 3.

Figure 17:
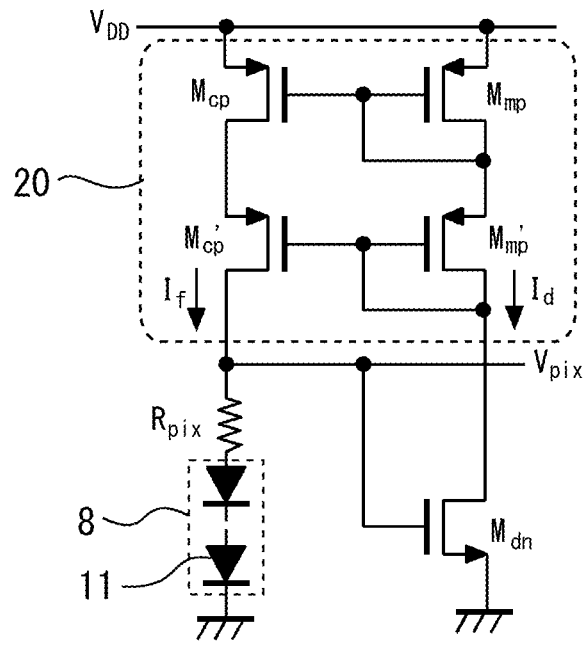
FIG. 17 is a circuit diagram illustrating a modification of the infrared detecting device according to Embodiment 6.

FIG. 17 is a circuit diagram illustrating a modification of the infrared detecting device according to Embodiment 6. A current mirror circuit 20 includes cascode-connected P-type MOS transistors Mmp, Mcp, Mmp', and Mcp'. The P-type MOS transistor Mmp has its drain and gate connected to each other, and is connected to a gate of the P-type MOS transistor Mcp. The P-type MOS transistors Mmp and Mcp have their respective sources connected to a power supply $V_{DD}$. The P-type MOS transistor Mmp' has its drain and gate connected to each other, and is connected to a gate of the P-type MOS transistor Mcp'. The P-type MOS transistors Mmp' and Mcp' have their respective sources connected to the drain of the P-type MOS transistor Mmp and a drain of the P-type MOS transistor Mcp. The drain of the P-type MOS transistor Mmp' is connected to a drain of an N-type MOS transistor Mdn, and the P-type MOS transistor Mcp' has its drain connected to a resistor $R_{pix}$. As a result, respective drain voltages of the P-type MOS transistor Mmp and the P-type MOS transistor Mcp in the current mirror circuit 20 match each other, and the replication accuracy of a current in the current mirror circuit 20 is improved. Other components and effects are similar to those in Embodiment 4.

Embodiment 7

Figure 18:
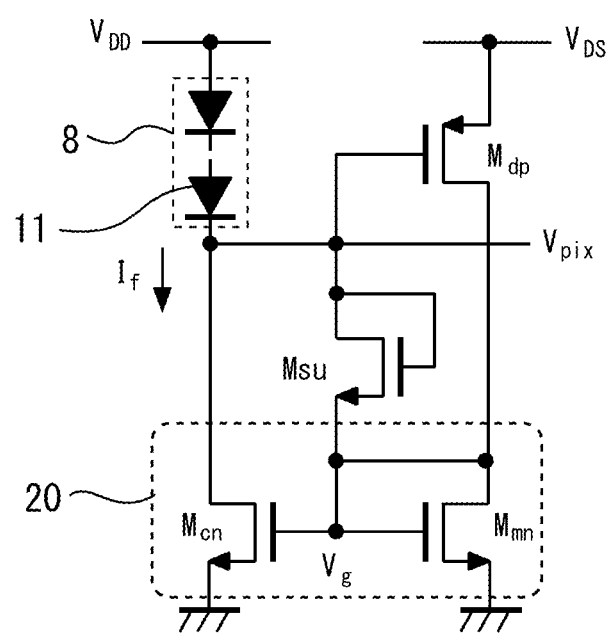
FIG. 18 is a circuit diagram illustrating an infrared detecting device according to Embodiment 7.

FIG. 18 is a circuit diagram illustrating an infrared detecting device according to Embodiment 7. A current mirror circuit 20 includes N-type MOS transistors Mmn and Mcn. The N-type MOS transistor Mmn has its drain and gate connected to each other, and is connected to a gate of the N-type MOS transistor Mcn. The N-type MOS transistors Mmn and Mcn have their respective sources grounded. The drain of the N-type MOS transistor Mmn is connected to a drain of a P-type MOS transistor Mdp, and the N-type MOS transistor Mcn has its drain connected to an infrared sensing portion 8. An N-type MOS transistor Msu is diode-connected between a cathode of a diode 11 and the gate of the N-type MOS transistors Mmn and a gate of the N-type MOS transistor Mcn in a current source of the current mirror circuit 20. The N-type MOS transistor Msu has its gate and drain connected to the cathode of the diode 11, and the N-type MOS transistor Msu has its source connected to the respective gates of the N-type MOS transistors Mmn and Mcn. A threshold voltage of the MOS transistor Msu is set lower than a voltage of a power supply $V_{DD}$ to be applied to an anode of the diode 11, and is set higher than a normal operation voltage range as a voltage range between an upper limit value and a lower limit value of a cathode voltage $V_{pix}$ of the diode 11 that changes by incidence of infrared rays from an object in a subject temperature range (from a lower limit temperature to an upper limit temperature) as a detection target of the infrared detecting device. Other components are similar to those in Embodiment 1.

In Embodiment 1, a stable point exists even when If=0, Vg=0, and $V_{pix}=V_{DD}$. In the present embodiment, the MOS transistor Msu is turned on at the time of defective startup. When the voltage $V_{pix}$ is forcedly reduced, a current is made to flow through the MOS transistors Mdp, Mmn, and Mcn in this order so that the infrared detecting device can be reliably started up. In addition, a similar effect to that in Embodiment 1 can be obtained.

Embodiment 8

Figure 19:
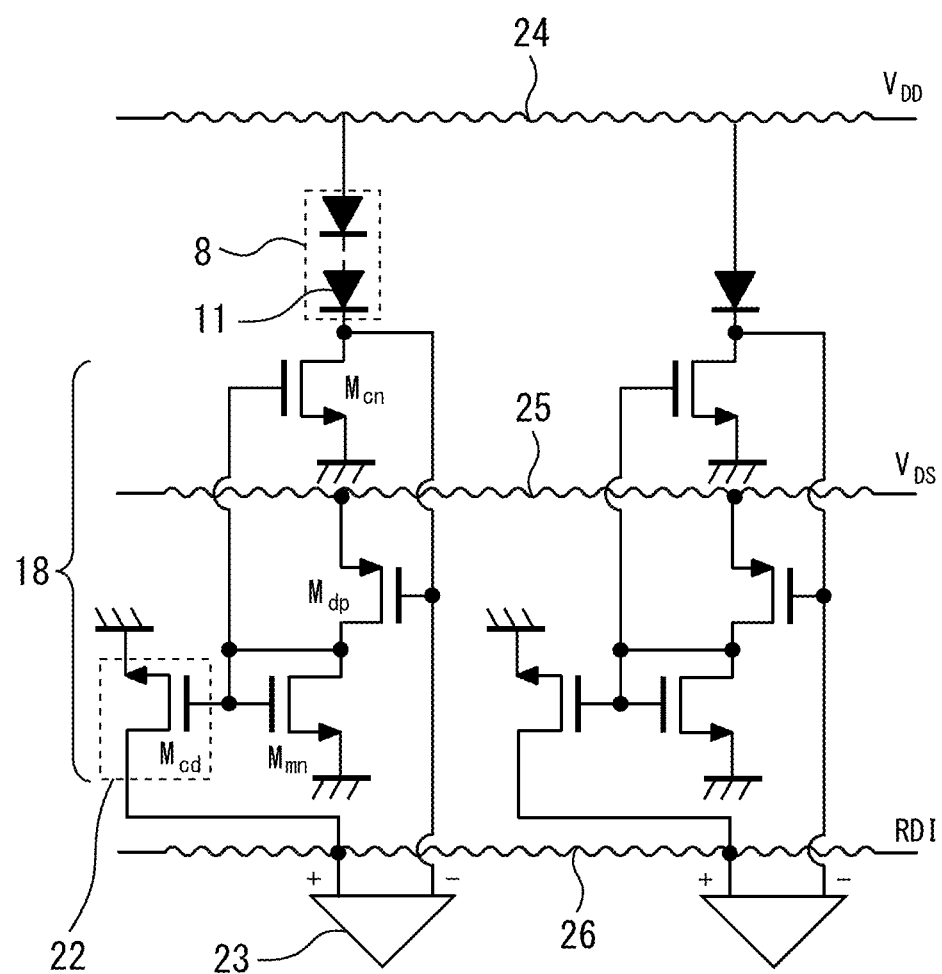
FIG. 19 is a circuit diagram illustrating an infrared detecting device according to Embodiment 8.

FIG. 19 is a circuit diagram illustrating an infrared detecting device according to Embodiment 8. A plurality of infrared sensing portions 8 are arranged in an array shape. A positive feedback circuit 18, a current source 22, and a differential integration circuit 23 are provided for each column including each of a plurality of infrared sensing portions 8 arranged in an array shape. Each of the infrared sensing portions 8 includes a plurality of diodes 11 connected in series. Therefore, the positive feedback circuit 18 is provided for each column of the plurality of diodes 11 connected in series. MOS transistors Mmn and Mcn in the current mirror circuit 20 have the same specification, and a current mirror ratio κ of the current mirror circuit 20 is 1.

The diodes 11 in the plurality of infrared sensing portions 8 have their respective anodes sequentially connected to a driving line 24 in an arrangement direction of the plurality of infrared sensing portions 8. One end of the driving line 24 is connected to a power supply $V_{DD}$. P-type MOS transistors Mdp in the plurality of positive feedback circuits 18 have their respective sources sequentially connected to a circuit power supply line 25 in the arrangement direction of the plurality of infrared sensing portions 8. One end of the circuit power supply line 25 is connected to a power supply $V_{DS}$. The plurality of current sources 22 are sequentially connected to a dummy driving line 26 in the arrangement direction of the plurality of infrared sensing portions 8.

The circuit power supply line 25, the driving line 24, and the dummy driving line 26 have the same resistance. The current source 22 includes a MOS transistor Mcd having the same specification as that of the MOS transistors Mmn and Mcn in the corresponding current mirror circuit 20. Respective gates of the MOS transistors Mmn and Mcn in the corresponding current mirror circuit 20 and a gate of the N-type MOS transistor Mcd in the current source 22 are commonly connected. The N-type MOS transistor Mcd has its source grounded, and the N-type MOS transistor Mcd has its drain connected to the dummy driving line 26. A current value of the current source 22 is set such that a potential distribution of the dummy driving line 26 and a potential distribution of the driving line 24 in the arrangement direction of the plurality of infrared sensing portions 8 are the same. Therefore, a voltage drop of the driving line 24 is simulated on the dummy driving line 26.

A connection point between the diode 11 in the infrared sensing portion 8 and the driving line 24 and a connection point between the corresponding current source 22 and the dummy driving line 26 are at the same position in the arrangement direction of the plurality of infrared sensing portions 8. The differential integration circuit 23 amplifies a difference between an output voltage of the corresponding current mirror circuit 20 and a voltage of the connection point between the corresponding current source 22 and the dummy driving line 26 and outputs the difference. As a result, even if a voltage change of the driving line 24 occurs due to a current change of the certain diode 11, an effect on an output of the infrared sensing portion 8 including the other diode 11 can be eliminated.

Embodiment 9

Figure 20:
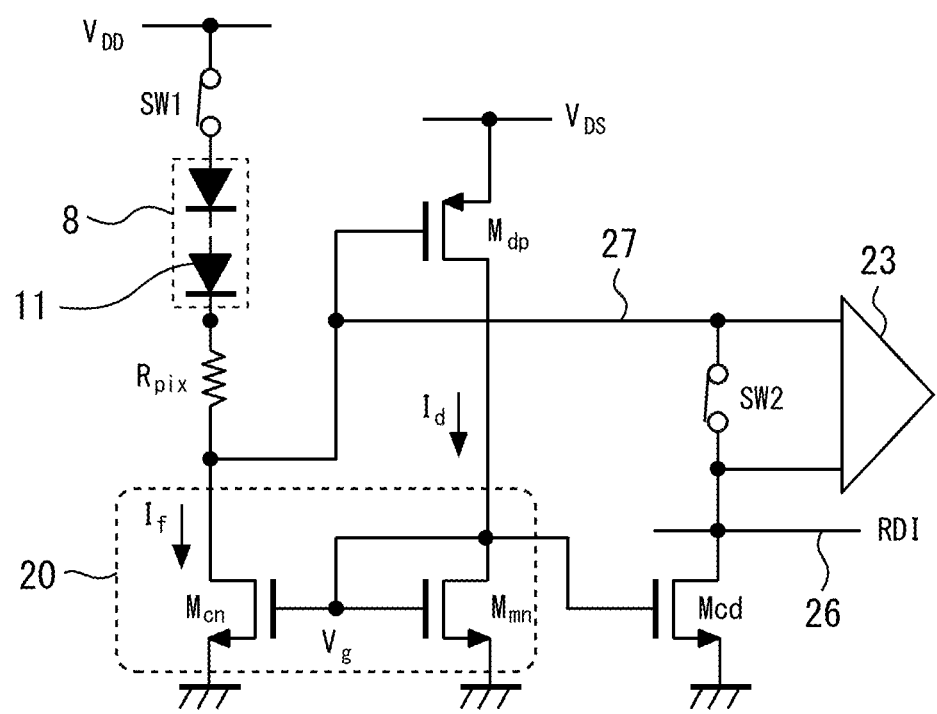
FIG. 20 is a circuit diagram illustrating an infrared detecting device according to Embodiment 9.

FIG. 20 is a circuit diagram illustrating an infrared detecting device according to Embodiment 9. A signal line 27 connects a cathode of a diode 11 to a corresponding differential integration circuit 23. A switch SW1 is connected between a power supply $V_{DD}$ that supplies a voltage to the diode 11 and an anode of the diode 11. A switch SW2 for startup is connected between a dummy driving line 26 and the signal line 27. Specifically, one end of the switch SW2 is connected to the signal line 27, and the other end of the switch SW2 is connected to the differential integration circuit 23, a drain of an N-type MOS transistor Mcd, and the dummy driving line 26.

The switch SW2 short-circuits the signal line 27 and the dummy driving line 26 in a horizontal blanking period, and a gate voltage of a P-type MOS transistor Mdp is forcedly reduced to make a current flow. As a result, the infrared detecting device can be normally started up. For example, the switch SW2 is operated at a timing reverse to that of the switch SW1.

REFERENCE SIGNS LIST 1 substrate; 8 infrared sensing portion; 11 diode; 18 positive feedback circuit; 20 current mirror circuit; 21 control circuit; 22 current source; 23 differential integration circuit; 24 driving line; 26 dummy driving line; 27 signal line; Mdp, Mmp,Mcp,Mmp',Mcp' P-type MOS transistor; Mdn,Mmn, Mcn,Mmn',Mcn',Msu N-type MOS transistor; $R_{pix}$ resistor; SW2 switch

The invention claimed is:
1. An infrared detecting device comprising:
a substrate;
a diode provided on the substrate and thermally insulated from the substrate; and
a positive feedback circuit providing a positive feedback loop so that when a current of the diode decreases due to a change in temperature of the diode, the positive feedback circuit further decreases the current of the diode, and when the current of the diode increases, the positive feedback circuit further increases the current of the diode,
wherein the positive feedback circuit includes a P-type MOS transistor having a gate receiving cathode voltage of the diode and a source connected to a power source, and a current mirror circuit receiving a drain current of the P-type MOS transistor and having an output connected to a cathode of the diode, and a cathode of the diode and the gate of the P-type MOS transistor are connected to an output of the infrared detecting device, or
wherein the positive feedback circuit includes an N-type MOS transistor having a gate receiving anode voltage of the diode and a source that is grounded, and a current mirror circuit receiving a drain current of the N-type MOS transistor and having an output connected to an anode of the diode, and an anode of the diode and the gate of the N-type MOS transistor are connected to an output of the infrared detecting device.

2. The infrared detecting device according to claim 1, wherein 0<κ·gmd·Z<1 is satisfied, where Z is an impedance of the diode, gmd is a mutual conductance of the P-type MOS transistor, and κ is a current mirror current ratio of the current mirror circuit.

3. The infrared detecting device according to claim 1, wherein 0<κ·gmd·Z<1 is satisfied, where Z is an impedance of the diode, gmd is a mutual conductance of the N-type MOS transistor, and κ is a current mirror current ratio of the current mirror circuit.

4. The infrared detecting device according to claim 1, further comprising a resistor connected between the diode and an output of the current mirror circuit.

5. The infrared detecting device according to claim 4, wherein the resistor is composed of a MOS transistor,
   the infrared detecting device further comprises a control circuit changes a gate voltage of the MOS transistor according to an environmental temperature as a temperature around the infrared detecting device when using the infrared detecting device, and
   the higher the environmental temperature becomes, the smaller a resistance value of the resistor is made by the control circuit.

6. The infrared detecting device according to claim 1, wherein an anode of the diode and a source of the P-type MOS transistor are connected to the same potential.

7. The infrared detecting device according to claim 1, wherein the current mirror circuit includes cascode-connected transistors.

8. The infrared detecting device according to claim 1, further comprising a MOS transistor diode-connected between a cathode of the diode and a gate of a transistor of the current mirror circuit,
   wherein a threshold voltage of the MOS transistor is lower than a voltage of a power supply to be applied to an anode of the diode, and is higher than a normal operation voltage range as a voltage range between an upper limit value and a lower limit value of a cathode voltage of the diode that changes by incidence of infrared rays from an object in a subject temperature range as a detection target of the infrared detecting device.

9. The infrared detecting device according to claim 1 comprising:
   a plurality of infrared sensing portions arranged in an array shape on the substrate,
   each of the positive feedback circuits is provided for each column of the plurality of infrared sensing portions arranged in an array shape,
   wherein each infrared sensing portion includes a plurality of diodes connected in series and thermally insulated from the substrate.

10. The infrared detecting device according to claim 9, wherein each positive feedback circuit includes a P-type MOS transistor having a gate receiving cathode voltage of the diode of the corresponding infrared sensing portion, and a current mirror circuit receiving a drain current of the P-type MOS transistor and having an output connected to a cathode of the diode,
    the infrared detecting device further comprises a driving line to which anodes of the diodes in the plurality of infrared sensing portions are sequentially connected in an arrangement direction of the plurality of infrared sensing portions, a plurality of current sources provided for the positive feedback circuits respectively, a dummy driving line to which the plurality of current sources are sequentially connected in the arrangement direction, and a plurality of differential integration circuits provided for the plurality of infrared sensing portions respectively,
    the driving line and the dummy driving line have the same resistance,
    current values of the plurality of current sources are set such that a potential distribution of the dummy driving line and a potential distribution of the driving line in the arrangement direction are the same, and
    the differential integration circuit outputs a difference between an output voltage of the corresponding current mirror circuit and a voltage of a connection point between the corresponding current source and the dummy driving line.

11. The infrared detecting device according to claim 10, wherein the current source includes a MOS transistor having the same specification as that of the MOS transistor in the corresponding current mirror circuit, and
    a gate of the MOS transistor in the corresponding current mirror circuit and a gate of the MOS transistor in the current source are commonly connected.

12. The infrared detecting device according to claim 10, further comprising a signal line connecting a cathode of the diode to the corresponding differential integration circuit, and a switch connected between the dummy driving line and the signal line.

* * * * *